United States Patent
Xiang

(10) Patent No.: US 8,207,698 B2
(45) Date of Patent: Jun. 26, 2012

(54) ELECTRIC DRIVE SYSTEM FOR AN AUTOMOTIVE VEHICLE

(75) Inventor: Joseph Youqing Xiang, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 730 days.

(21) Appl. No.: 12/391,584

(22) Filed: Feb. 24, 2009

(65) Prior Publication Data

US 2010/0213884 A1    Aug. 26, 2010

(51) Int. Cl.
*H02P 3/18* (2006.01)
*H02P 6/00* (2006.01)
*H02P 23/00* (2006.01)
*H02P 25/00* (2006.01)

(52) U.S. Cl. ........................... 318/716; 318/139
(58) Field of Classification Search ............... 318/716, 318/139

See application file for complete search history.

(56) References Cited

U.S. PATENT DOCUMENTS

| 6,137,418 A | 10/2000 | Zuercher et al. |
| 7,271,557 B2 | 9/2007 | Ajima et al. |

FOREIGN PATENT DOCUMENTS

| EP | 0 105 077 B1 | 4/1984 |
| EP | 0 845 681 B1 | 5/2003 |
| WO | 2006136520 A1 | 12/2006 |

*Primary Examiner* — Lincoln Donovan
*Assistant Examiner* — Erick Glass
(74) *Attorney, Agent, or Firm* — David B. Kelley; Brooks Kushman P.C.

(57) ABSTRACT

An electric drive system in an automotive vehicle includes a controller for determining a condition of the electric drive system. The electric drive system includes only two current sensors and a common-mode current transformer. In response to the current sensors and the common-mode current transformer, the controller determines the condition of the electric drive system. The condition of the electrical drive system may depend on a condition of an electrical connection between a drive system inverter and a motor in the electric drive system as well as a calculated amount of error in the electric drive system. In addition, the controller may control various operations of the electric drive system, which may or may not depend on the condition of the electric drive system.

20 Claims, 3 Drawing Sheets

ELECTRIC DRIVE SYSTEM FOR AN AUTOMOTIVE VEHICLE

BACKGROUND

1. Technical Field

Electric drive system for an automotive vehicle.

2. Background Art

An electric drive system in an automotive vehicle typically includes a power electronics inverter and a permanent-magnet synchronous motor (PMSM). The inverter and the PMSM are typically spaced apart to reduce the total cost of the electric drive system and improve system package. Furthermore, the electric drive system may include an interlock system in an effort to increase the reliability and the safety of the electric drive system. The interlock system detects whether an electrical connection between the power electronics inverter and the PMSM is loose or disconnected. A three-wire high-voltage cable typically provides the electrical connection.

FIG. 1 illustrates a prior art three-phase PMSM electric drive system 1 of an automotive vehicle having an inverter 2, a motor 3, a three-wire high-voltage cable 4 connecting the inverter 2 and the motor 3, an interlock system 5, and three high-bandwidth current sensors 9.

The current sensors 9 of FIG. 1 sense currents flowing through the three-wire high-voltage cable 4 in the electric drive system 1 and generate three current signals. The three current signals indicate the amount of current flowing through the three-wire high-voltage cable 4. Due to the symmetry of the electric drive system 1, only two of the three current signals that the current sensors 9 produce are independent. Thus, the three current signals from the current sensors 9 can be summed to check the in-range error of the electric drive system 1. However, the current sensors 9 increase the cost, size, and need for non-standardized components in the electric drive system 1.

The interlock system 5 in the electric drive system 1 of FIG. 1 has a dedicated circuit 6 and a dedicated low-voltage signal cable 7. The dedicated low-voltage signal cable 7 is embedded into various parts of the electric drive system 1 and can form an electrical circuit with the dedicated circuit 6. The dedicated low-voltage signal cable 7 is embedded into the three-wire high-voltage cable 4 that connects the inverter 2 and the motor 3. In addition, the dedicated low-voltage signal cable 7 is embedded in connectors 8 of the three-wire high-voltage cable 4. Thus, the electric drive system 1 requires the use of non-standard components, such as the cable 4 and the connectors 8 that have the dedicated low-voltage signal cable 7 embedded therein.

The dedicated circuit 6 detects whether the dedicated low-voltage signal cable 7 completes an electrical circuit with the dedicated circuit 6. If the dedicated low-voltage signal cable 7 does not complete the electrical circuit, then the dedicated circuit 6 indicates that the three-wire high-voltage cable 4 does not properly electrically connect the inverter 2 to the motor 3. On the other hand, if the dedicated low-voltage signal cable 7 completes the electrical circuit, then it may be assumed that the three-wire high-voltage cable 4 properly connects the inverter 2 to the motor 3 since the dedicated low-voltage signal cable 7 completes the electrical circuit.

The interlock system 5 illustrated in FIG. 1 does not directly detect whether the three-wire high-voltage cable 4 properly connects the motor 3 and the inverter 2. Instead, the interlock system 5 merely indicates whether the dedicated low-voltage signal cable 7 completes an electrical circuit with the dedicated circuit 6. Completion of an electrical circuit with the dedicated circuit 6 does not conclusively indicate that the inverter 2 is properly connected to the motor 3. Consequently, the interlock system 5 illustrated in FIG. 1 may create false and unnecessary failure modes.

Furthermore, the interlock system 5 increases the cost of the electric drive system 1 because non-standardized components are used. The non-standardized components include the dedicated circuit 6, the three-wire high-voltage cable 4 having the dedicated low-voltage signal cable 7 embedded therein, and the connectors 8 including the dedicated low-voltage signal cable 7 embedded therein. Furthermore, the interlock system 5 uses the three high-bandwidth current sensors 9, which increases the cost of the interlock system 5.

It is often desirable or necessary to decrease the cost and size of the electric drive system in the automotive vehicle. Furthermore, it is often desirable or necessary to simplify or reduce the need for non-standardized components in the electric drive system. In addition, it may be desirable or necessary to increase the reliability of the electric drive system. Furthermore, it may be desirable or necessary to increase the efficiency, speed, and accuracy of the electric drive system.

SUMMARY

An electric drive system in an automotive vehicle is provided. The electric drive system may include a drive system inverter, a three-phase synchronous motor, and a three-wire high-voltage cable extending between the drive system inverter and the motor. In addition, the electric drive system may include a pair of current sensors. The current sensors generate respective sensor signals indicating respective amounts of current flowing through the three-wire high-voltage cable. Also, the electric drive system may include a resolver. The resolver generates a resolver signal that has position information of the motor.

The electric drive system may include a voltage source inverter in the drive system inverter. The voltage source inverter generates a high-frequency common-mode pulse-width-modulated voltage and applies the high-frequency common-mode pulse-width-modulated voltage between the drive system inverter and the motor. This provides a common-mode current through the three-wire high-voltage cable.

The electric drive system may include a current transformer for sensing a high-frequency common-mode current flowing through the three-wire high-voltage cable. The current transformer includes secondary windings and a processor. The processor receives the high-frequency common-mode current from the secondary windings and generates a common-mode current signal.

The electric drive system includes a controller. The controller compares the high-frequency common-mode current, which is embedded in the common-mode current signal, to a predetermined common-mode current threshold to determine whether the cable provides an electrical connection between the drive system inverter and the motor. In addition, the controller receives the respective sensor signals and the resolver signal to calculate an amount of error between calculated currents and estimated currents. Furthermore, the controller determines a condition of the electric drive system. The condition may be based on whether the cable provides the electrical connection. In addition, the condition may be based on the amount of error between the calculated currents and the estimated currents.

The controller of the electric drive system may include a dynamic state estimator. The dynamic state estimator executes various operations of the controller.

DETAILED DESCRIPTION OF AN EMBODIMENT OF THE INVENTION

An embodiment of the present invention includes an electric drive system for an automotive vehicle. The electric drive system has a controller to determine a condition of the electric drive system based on one or more determinations. For example, the controller may determine an "interlocking condition" or a condition of an electrical connection between a drive system inverter and a motor in the electric drive system. Based on the interlocking condition, the controller can determine the condition of the electric drive system. Furthermore, the controller may calculate an amount of error between calculated currents and estimated currents to determine whether one or more problems exist in the electric drive system. In addition, the controller may control various operations of the electric drive system, which may or may not depend on the condition of the electric drive system.

Figure 2:
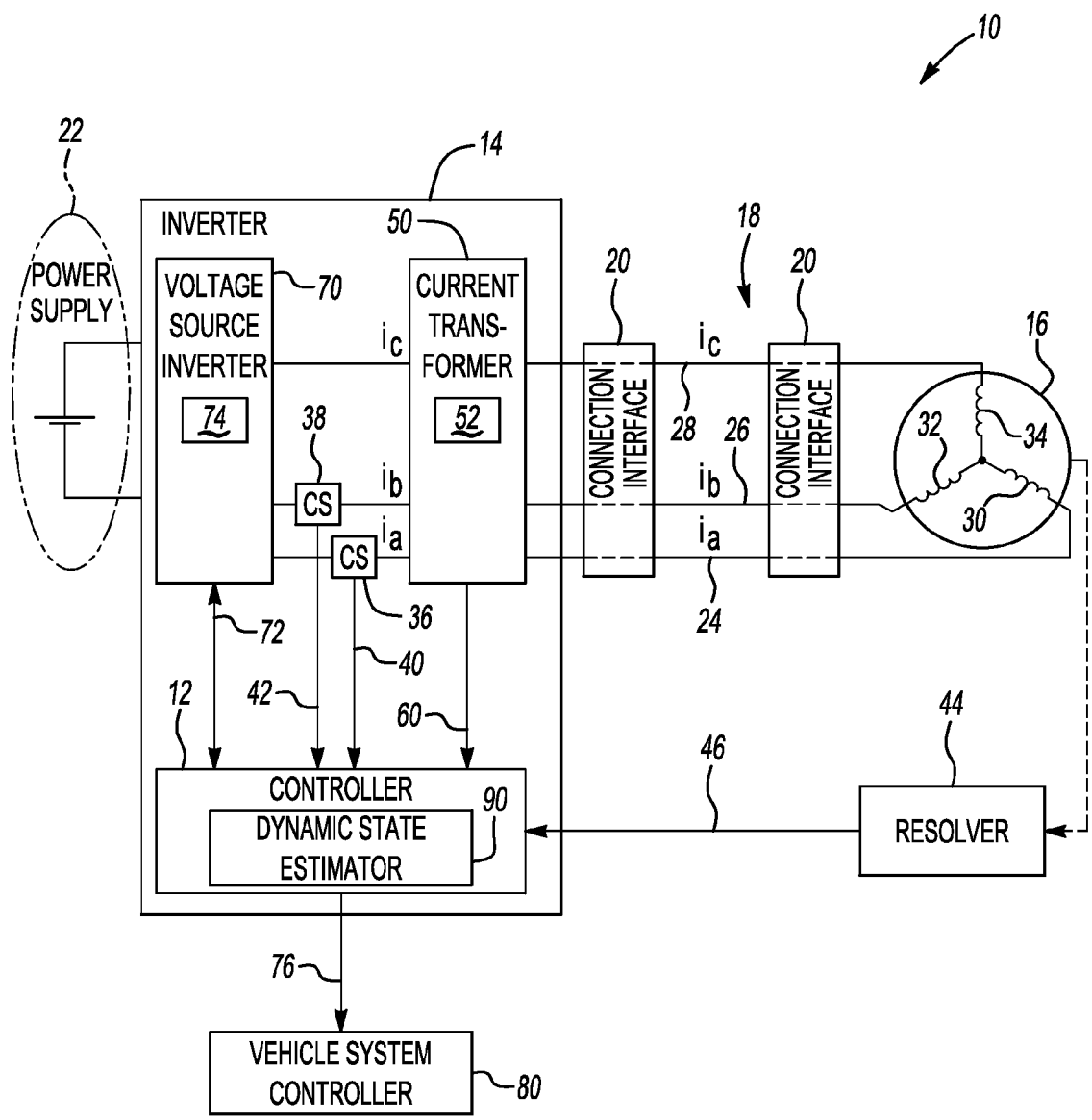
FIG. 2 is a schematic diagram illustrating an electric drive system of an automotive vehicle having only two current sensors, a three-wire high-voltage cable, a common-mode current transformer, and a controller for determining a condition of the electric drive system.

FIG. 2 shows an electric drive system 10 for an automotive vehicle (not illustrated). The automotive vehicle may be an electric vehicle, a hybrid electric vehicle (HEV), a plug-in hybrid electric vehicle (PHEV), or any other automotive vehicle having a drive system that is electrically powered.

With continuing reference to FIG. 2, the electric drive system 10 includes a controller 12. The controller 12 determines a condition of the electric drive system 10. The condition may indicate whether the electric drive system 10 is operating as desired or has one or more problems. In addition, the condition of the electric drive system 10 may indicate whether a system or subsystem in the automotive vehicle, such as the electric drive system 10, needs to be modified or changed. The electric drive system 10 and its method of operation are described in an integrated manner to facilitate understanding of various aspects of the invention.

As shown in FIG. 2, the electric drive system 10 includes a drive system inverter 14 (hereinafter "inverter"), a three-phase permanent-magnet synchronous motor (PMSM) 16 (hereinafter "motor"), and a three-wire high-voltage cable 18 (hereinafter "cable"). The cable 18 extends between the inverter 14 and the motor 16 to provide an electrical connection between the inverter 14 and the motor 16. However, the cable 18 may become loose or disconnected and cause the inverter 14 to be electrically disconnected from the motor 16. For example, the inverter 14 and the motor 16 may be electrically disconnected if the cable 18 is improperly installed in the electric drive system 10, such as during assembly of the automotive vehicle.

As illustrated in FIG. 2, the electric drive system 10 may include a connection interface 20. The connection interface 20 allows the cable 18 to be electrically and mechanically connected to the inverter 14, the motor 16, or both the inverter 14 and the motor 16. The cable 18 may be inserted into each of the connection interfaces 20 to allow electrical power to transfer from the inverter 14 to the motor 16.

Referring to FIG. 2, the electric drive system 10 includes a power supply 22. The power supply 22 may be a battery or some other direct current (DC) power source. The power supply 22 provides a DC voltage to the inverter 14.

As illustrated in FIG. 2, the inverter 14 converts the direct current (DC) from the power supply 22 to alternating currents or motor phase currents $i_a$, $i_b$, and $i_c$ (illustrated in FIG. 2). In operation, the motor phase currents $i_a$, $i_b$, and $i_c$ drive the motor 16. Furthermore, the inverter 14 may be a three-phase pulse-width-modulated (PWM) inverter. The three-phase PWM inverter modulates the motor phase currents $i_a$, $i_b$, and $i_c$ such that the motor phase currents $i_a$, $i_b$, and $i_c$ are three-phase pulse-width-modulated (PWM) currents that drive the motor 16.

As shown in FIG. 2, the cable 18 includes three wires: a first wire 24, a second wire 26, and a third wire 28. The first wire 24 allows motor phase current $i_a$ to flow through the inverter 14 and into a first armature winding 30 of the motor 16. Similarly, the second wire 26 allows motor phase current $i_b$ to flow through the inverter 14 and into a second armature windings 32 of the motor 16. Likewise, the third wire 28 allows motor phase current $i_c$ to flow through the inverter 14 and into a third armature windings 34 of the motor 16.

As illustrated in FIG. 2, the electric drive system 10 may include a first current sensor 36 and a second current sensor 38. The first current sensor 36 senses a first amount of current ($i_a$) flowing through the first wire 24 and generates a first sensor signal 40. Similarly, the second current sensor 38 senses a second amount of current ($i_b$) flowing through the second wire 26 and generates a second sensor signal 42. The first and second amounts of current ($i_a$, $i_b$) are embedded or encoded in respective first and second sensor signals 40, 42.

Referring to FIG. 2, the electric drive system 10 may include a resolver 44. The resolver 44 senses position of a rotor (not illustrated) in the motor 16. In addition, the resolver 44 generates a resolver signal 46 having rotor position information embedded or encoded therein. The controller 12 can obtain various parameters (e.g., $L_d$, $L_q$, $R_s$ and $\lambda_{pm}$) and operation conditions ($V_d$, $V_q$, and $\omega$) of the motor 16 from the resolver signal 46. $L_d$ indicates d-axis inductance, $L_q$ indicates q-axis inductance, $R_s$ indicates resistance of stator phase winding, and $\lambda_{pm}$ indicates peak flux linkage of the phase windings due to permanent magnet excitation, $V_d$ indicates d-axis voltage, $V_q$ indicates q-axis voltage, and $\omega$ indicates rotor speed. The resolver signal 46 may include other pulse-width-modulated (PWM) voltage information corresponding to a PWM voltage sensed between the inverter 14 and the motor 16 during one or more time intervals.

As illustrated in FIG. 2, the electric drive system 10 includes a common-mode current transformer 50 (hereinafter "transformer"). The transformer 50 detects a high-frequency common-mode current flowing through the three wires 24, 26, 28 of the cable 18. The transformer 50 is positioned within the inverter 14 of the electric drive system 10 (as shown in FIG. 2). However, the transformer 50 may be positioned in any suitable portion of the electric drive system 10. In addition, the transformer 50 may be a rugged passive element configured to provide a reliable detection. In addition, the transformer 50 may be a high-frequency current transformer or other suitable current transformer configured to detect the high-frequency common-mode current flowing through the cable 18. For example, the transformer 50 may operate between 10 kHz and 50 kHz.

Figure 3:
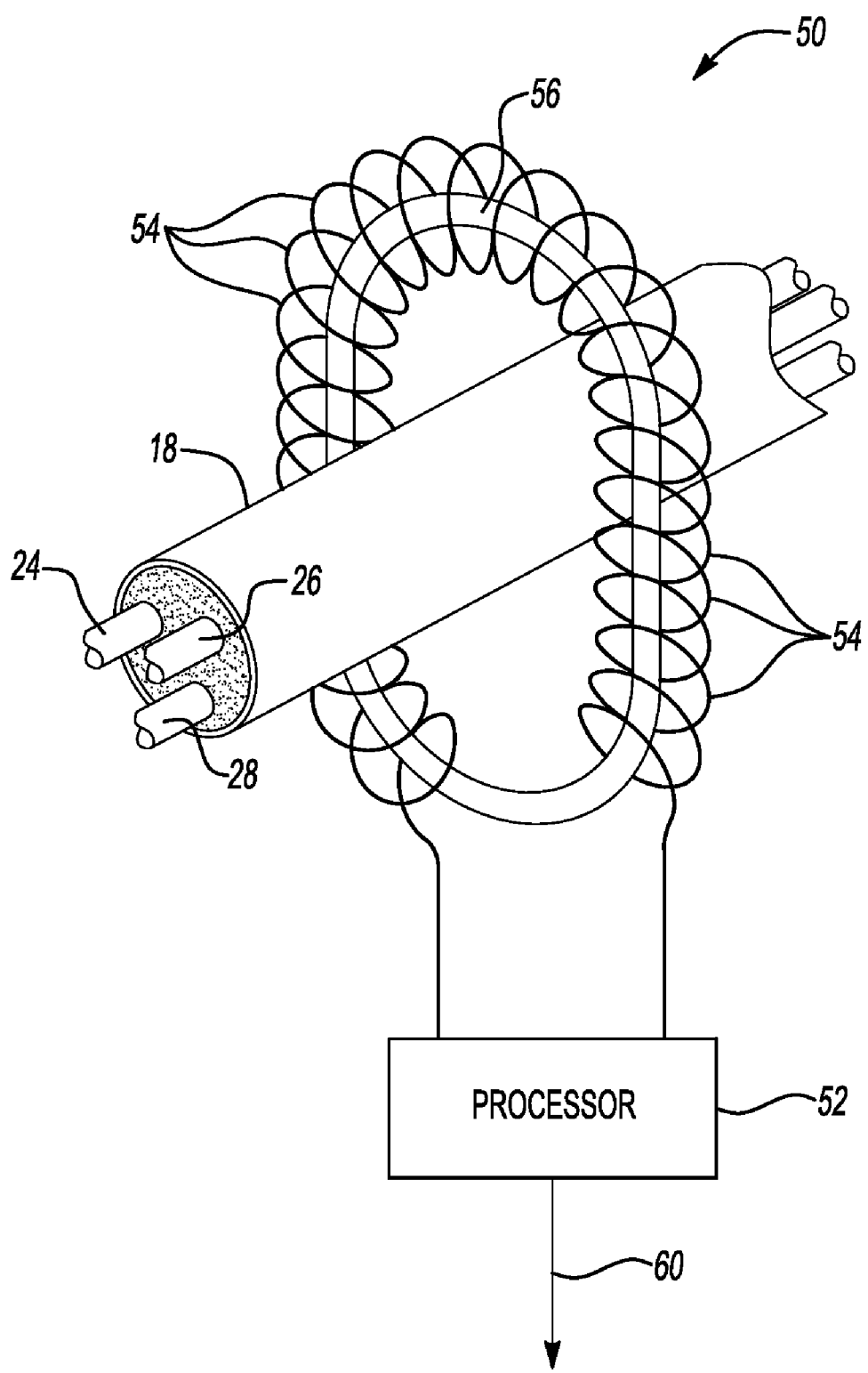
FIG. 3 is a fragmentary perspective view illustrating the transformer of FIG. 2 including a processor, secondary windings, and a magnetic core for detecting a high-frequency common-mode current flowing through wires of the cable.

Referring to FIG. 3, the transformer 50 is positioned adjacent to the cable 18 and includes a processor 52. The wires 24, 26, and 28 of the cable 18 provide the primary windings to the transformer 50. In addition, the transformer 50 includes secondary windings 54. The secondary windings 54 are positioned around or wound upon at least a portion the cable 18 and connect to the processor 52. The secondary windings 54 can be used to sense the high-frequency common-mode current (not illustrated) flowing through the three wires 24, 26, 28 in the cable 18. The high-frequency common-mode current is embedded in the motor phase currents $i_a$, $i_b$, and $i_c$ (illustrated in FIG. 2) flowing through the three wires 24, 26, 28. Operation of the inverter 14 and/or stray capacitance inside the motor 16 produces the high-frequency common-mode current. Furthermore, the transformer 50 may include a magnetic core 56 around the cable 18 to enhance sensing of the high-frequency common-mode current via the secondary windings 54.

With continuing reference to FIG. 3, the processor 52 of the transformer 50 receives the high-frequency common-mode current via the secondary windings 54 and generates a common-mode current signal 60 having information on the high-frequency common-mode current that was sensed flowing through the three wires 24, 26, 28 of the cable 18.

The transformer 50 can detect the high-frequency common-mode current and obtain the common-mode current signal 60 in various states of the electric drive system 10. For example, the state of the electric drive system 10 may be a current-regulated PWM state, a six-step operation state, or an idle state. During the idle state, the motor 16 is not propelling the automotive vehicle and no switching of power semiconductor devices occurs in the inverter 14. The power semiconductor devices may be insulated-gate bipolar transistors (IGBTs).

Referring again to FIG. 2, the electric drive system 10 may include a voltage source inverter 70 to generate and apply a high-frequency common-mode PWM voltage between the inverter 14 and the motor 16. The voltage source inverter 70 may apply the high-frequency common-mode PWM voltage at any time, including when the motor 16 of the electric drive system 10 is in the idle state. When the voltage source inverter 70 applies the high-frequency common-mode PWM voltage between the inverter 14 and the motor 16, the high-frequency common-mode current becomes embedded in the motor phase currents $i_a$, $i_b$, and $i_c$ (illustrated in FIG. 2) flowing through the cable 18. Therefore, the transformer 50 may detect the high-frequency common-mode current when the voltage source inverter 70 applies the high-frequency common-mode PWM voltage between the inverter 14 and the motor 16. Since detection of the high-frequency common-mode current may occur when the electric drive system 10 is in the idle state, the transformer 50 can generate the common-mode current signal 60 without any torque generated by the motor 16.

The electric drive system 10 of FIG. 2 may monitor the electrical connection that the cable 18 provides between the inverter 14 and the motor 14 and detect whether the cable 18 properly connects the inverter 14 to the motor 14. One of the conditions of the electric drive system 10 that the controller 12 may determine is an "interlocking condition." The interlocking condition indicates a condition of the electrical connection between the inverter 14 and the motor 16. In addition, the controller 12 may determine the condition of the electric drive system 10 based on the interlocking condition.

The controller 12 of the electric drive system 10 receives the common-mode current signal 60 from the transformer 50 to determine whether the cable 18 is properly connected between the inverter 14 and the motor 16. In operation, the controller 12 compares the high-frequency common-mode current embedded or encoded on the common-mode current signal 60 to a common-mode current threshold (hereinafter "threshold"). If the high-frequency common-mode current is greater than the threshold, then the controller 12 determines the cable 18 is properly connected as well as the interlocking condition of the electric drive system 10 as acceptable. However, when the high-frequency common-mode current is smaller than the threshold, the controller 12 determines that the inverter 14 is inadequately connected to the motor 16. In addition, the controller 12 determines that the interlocking condition of the electric drive system 10 has a problem. For example, the problem may be that the cable 18 is loose, disconnected, or otherwise not providing a proper or adequate electrical connection between the inverter 14 and the motor 16.

As illustrated in FIG. 2, the controller 12 may control the electric drive system 10 along communication path 72 based on the interlocking condition of the electric drive system 10. For example, the controller 12 may generate and transmit a discharge signal along communication path 72 between the controller 12 and the voltage source inverter 70 when the controller 12 determines the condition of the electric drive system 10 as having one or more problems. The voltage source inverter 70 receives the discharge signal to discharge a DC bus capacitor 74 in the voltage source inverter 70.

The DC bus capacitor 74 may be discharged in any suitable manner. For example, the DC bus capacitor 74 may be discharged through loads in the same bus having the DC bus capacitor 74. Furthermore, the power supply 22 may be charged with energy stored in the DC bus capacitor 74 to discharge the DC bus capacitor 74. In addition, an internal discharging resistor (not illustrated) may be tuned to discharge the DC bus capacitor 74.

The DC bus capacitor 74 may be discharged for a number of reasons. For example, the DC bus capacitor 74 may be discharged to prevent injury to persons, damage to the electric drive system 10, or for other reasons. Furthermore, discharging the DC bus capacitor 74 may prevent electrical shock to a person trying to adjust the cable 18.

In addition to determining the "interlocking condition" and discharging the DC bus capacitor 74, the electric drive system 10 may monitor the cable 18 to control various systems or subsystems in the automotive vehicle, such as the torque and speed that the motor 16 generates. Furthermore, the controller 12 of the electric drive system 10 may receive and process signals other than the common-mode current signal 60 to control operations of the automotive vehicle. Controlling the various systems or subsystems in the automotive vehicle, such as the electric drive system 10, may or may not depend on the condition of the electric drive system 10 that the controller 12 determines.

As illustrated in FIG. 2, the controller 12 may receive and process the first sensor signal 40 indicating the first amount of current ($i_a$) flowing through the first wire 24 of the cable 18 as well as the second sensor signal 42 indicating the second amount of current ($i_b$) flowing through the second wire 26 of the cable 18. Recall, the first current sensor 36 transmits the first sensor signal 40 to the controller 12. Similarly, the second current sensor 38 transmits the second sensor signal 42 to the controller 12.

The controller 12 may receive and process the first and second sensor signals 40, 42 having $i_a$ and $i_b$ to determine the motor phase current $i_c$ flowing through the third wire 28 of the cable 18. The controller 12 may negate the sum of the first sensor signal 40 and the second sensor signal 42 to obtain the motor phase current $i_c$. Based on the motor phase currents $i_a$, $i_b$, and $i_c$, and the rotor position θ from the resolver signal 46, the controller 12 can apply an abc-to-dq transformation to obtain calculated currents. Using the abc-to-dq transformation equation below, the motor phase currents $i_a$, $i_b$, and $i_c$ (illustrated in FIG. 2) may be transformed into a first calculated current $i_d$ (not illustrated) and a second calculated $i_q$ (not illustrated):

$$\begin{bmatrix} i_a(k) \\ i_b(k) \\ i_c(k) \end{bmatrix} = \begin{bmatrix} 1 & 0 \\ -\frac{1}{2} & -\frac{\sqrt{3}}{2} \\ -\frac{1}{2} & \frac{\sqrt{3}}{2} \end{bmatrix} \begin{bmatrix} \cos(\theta(k)) & \sin(\theta(k)) \\ -\sin(\theta(k)) & \cos(\theta(k)) \end{bmatrix} \begin{bmatrix} i_d(k) \\ i_q(k) \end{bmatrix}$$

The first and second calculated currents $i_d$ and $i_q$ are mathematically created signals and therefore do not flow in any physical path. However, the controller 12 may process the calculated currents $i_d$ and $i_q$ and generate one or more signals in response to the calculated currents $i_d$ and $i_q$ to control or change the operation of various systems or subsystems in the automotive vehicle. In such an example, the calculated currents $i_d$ and $i_q$ may be used to control the torque and speed that the motor 16 generates.

As shown in FIG. 2, the controller 12 may monitor the electric drive system 10 and calculate an amount of error (not illustrated) between calculated currents and estimated currents to determine whether one or more problems exist in the electric drive system 10. In addition, the controller 12 may determine the condition of the electric drive system 10 based on the amount of error. Problems that may exist in the electric drive system 10 include a ground fault in the motor 16 as well as a failure of or damage to the electrical connection between the inverter 14 and the motor 16, one of the current sensors 36, 38, the resolver 44, a bus voltage sensor (not shown), or other components or subsystems in the electric drive system 10.

Referring to FIG. 2, the controller 12 receives and processes the first and second sensor signals 40, 42 and the resolver signal 46 to calculate the amount of error between calculated currents and estimated currents. Based on the motor phase currents $i_a$ and $i_b$ (illustrated in FIG. 2) from the sensor signals 40, 42 and rotor position $\theta_{re^{(k-1)}}$ from the resolver signal 46, the controller 12 can calculate the first and second calculated currents $i_d$ and $i_q$ (not illustrated). The controller 12 may calculate the first and second calculated currents $i_d$ and $i_q$ (not illustrated) using the following equation programmed into logic of the controller 12:

$$\begin{bmatrix} i_d(k-1) \\ i_q(k-1) \end{bmatrix} = \frac{2}{3} \begin{bmatrix} \cos(\theta(k-1)) & -\sin(\theta(k-1)) \\ \sin(\theta(k-1)) & \cos(\theta(k-1)) \end{bmatrix} \begin{bmatrix} 1 & -\frac{1}{2} & -\frac{1}{2} \\ 0 & -\frac{\sqrt{3}}{2} & \frac{\sqrt{3}}{2} \end{bmatrix} \begin{bmatrix} i_a(k-1) \\ i_b(k-1) \\ -i_a(k-1) - i_b(k-1) \end{bmatrix}$$

The motor phase currents $i_a$ and $i_b$ from the sensor signals 40, 42 correspond to $i_a(k-1)$ and $i_b(k-1)$ at $t=(k-1)T_s$. Likewise, the first and second calculated currents $i_d$ and $i_q$ correspond to $i_d(k-1)$ and $i_q(k-1)$ at $t=(k-1)T_s$.

In addition to calculating the calculated currents $i_d$ and $i_q$, the controller 12 calculates estimated currents, which are compared to the calculated currents $i_d$ and $i_q$ to calculate the amount of error between the calculated currents and the estimated currents. Based on commanded voltages $V_d$ and $V_q$, motor parameters $L_d$, $L_q$, $R_s$ and $\lambda_{pm}$, operating conditions $V_d$, $V_q$, and ω obtained from the resolver signal 46, and the following equation programmed into logic of the controller 12, the controller 12 may calculate a first estimated current $i_d(k)$ (not illustrated) and a second estimated current $i_q(k)$ (not illustrated) at time $t=K*T_s$:

$$\begin{bmatrix} i_d(k) \\ i_q(k) \end{bmatrix} = \begin{bmatrix} 1 - \frac{T_s R_s}{L_d} & \frac{\omega(k-1)T_s L_q}{L_d} \\ -\frac{\omega(k-1)T_s L_d}{L_q} & 1 - \frac{T_s R_s}{L_q} \end{bmatrix} \begin{bmatrix} i_d(k-1) \\ i_q(k-1) \end{bmatrix} + \begin{bmatrix} \frac{T_s v_d(k-1)}{L_d} \\ \frac{T_s v_q(k-1)}{L_q} - T_s \omega(k-1) * \lambda_{pm} \end{bmatrix}$$

After calculating the first and second estimated currents $i_d(k)$ and $i_q(k)$ from the resolver signal 46 and the sensor signals 40 and 42, the controller 12 can calculate the amount of error between the calculated currents and the estimated currents. The controller 12 may calculate the amount of error within either a dq-framework or an abc-framework, depending on the configuration of the electric drive system 10.

In the dq-framework, the controller 12 compares the first and second estimated currents $i_d(k)$ and $i_q(k)$ to the calculated currents $i_d$ and $i_q$ obtained from the current sensors 36, 38. More specifically, the controller 12 compares the first estimated current $i_d(k)$ to the calculated current $i_d$. In addition, the controller 12 compares the second estimated current $i_q(k)$ to the calculated current $i_q$. Based on the comparison of the dq-frame currents, the controller 12 can calculate the amount of error between the calculated currents and the estimated currents.

In the abc-framework, the controller 12 compares the motor phase currents $i_a$, $i_b$, and $i_c$ (illustrated in FIG. 2) obtained from the current sensors 36, 38 to estimated phase currents $i_a(k)$, $i_b(k)$, and $i_c(k)$ (not illustrated). To obtain the estimated phase currents $i_a(k)$, $i_b(k)$, and $i_c(k)$, the controller 12 may transform the first and second estimated amounts of current $i_d(k)$ and $i_q(k)$ to the estimated phase currents $i_a(k)$, $i_b(k)$, and $i_c(k)$. The controller 12 may use the following equation programmed in logic to execute the transformation:

$$\begin{bmatrix} i_a(k) \\ i_b(k) \\ i_c(k) \end{bmatrix} = \begin{bmatrix} 1 & 0 \\ -\frac{1}{2} & -\frac{\sqrt{3}}{2} \\ -\frac{1}{2} & \frac{\sqrt{3}}{2} \end{bmatrix} \begin{bmatrix} \cos(\theta(k)) & \sin(\theta(k)) \\ -\sin(\theta(k)) & \cos(\theta(k)) \end{bmatrix} \begin{bmatrix} i_d(k) \\ i_q(k) \end{bmatrix}$$

For each zero-cross points of the estimated phase currents $i_a(k)$, $i_b(k)$, and $i_c(k)$, the controller 12 may compare the estimated phase currents $i_a(k)$, $i_b(k)$, and $i_c(k)$ to corresponding currents: the first amount of current ($i_a$), the second amount of current ($i_b$), and the motor phase current $i_c$ that the controller 12 determines. Based on the comparison of $i_a(k)$ to $i_a$, $i_b(k)$ to $i_b$, and $i_c(k)$ to $i_c$, the controller 12 determines the amount of error between the calculated currents and the estimated currents. The controller 12 may calculate the amount of error in the abc-framework rather than the dq-framework in an effort to improve the accuracy of the controller 12 determining the amount of error between the calculated currents and the estimated currents.

The controller 12 may determine whether one or more problems exist in the electric drive system 10 based on the amount of error between the calculated currents and the estimated currents. As mentioned above, the problems may include the ground fault in the motor 16, the failure of or damage to the electrical connection between the inverter 14 and the motor 16, as well as failure or damage to one of the current sensors 36, 38, the resolver 44, a bus voltage sensor (not shown), or other components or subsystems in the electric drive system 10. For example, the amount of error between the calculated currents and the estimated currents may indicate that one of the current sensors 36, 38 has failed.

The controller 12 may determine the condition of the electric drive system 10 based on the amount of error between the calculated currents and the estimated currents in any suitable manner. In one example, the controller 12 of the electric drive system 10 determines whether the amount of error lies within a predetermined range of error to determine the condition of the electric drive system 10. When the amount of error lies within the predetermined range of error, the controller 12 determines the condition of the electric drive system 10 to be acceptable. However, when the amount of error lies outside the predetermined range of error, the controller 12 determines the condition of the electric drive system 10 to be unacceptable. In another example, the controller 12 determines the condition of the electric drive system 10 based on whether the amount of error is beyond a preset threshold. When the amount of error does not exceed the preset threshold, the controller 12 determines the condition of the electric drive system 10 to be acceptable. However, when the amount of error exceeds the preset threshold, the controller 12 determines the condition of the electric drive system 10 to be unacceptable. The predetermined range of error and the preset threshold may be programmed into memory (not shown) in the controller 12.

The controller 12 may determine the condition of the electric drive system 10 to be unacceptable if one of the current sensors 36, 38 has failed, become damaged, or is otherwise not operating correctly. In such an example, one of the current sensors 36, 38 causes the amount of error between the calculated currents and the estimated currents to lie outside the predetermined range of error or exceed the preset threshold. When the controller 12 determines that the amount of error is outside the predetermined range of error or beyond the preset threshold, then the controller 12 may determine that one of the current sensors 36, 38 has failed, become damaged, or is otherwise not operating correctly and that the condition of the electric drive system 10 to be unacceptable.

The controller 12 may reset when the controller 12 determines the condition of the electric drive system 10 to be acceptable. For example, if the amount of error is within the predetermined range of error or below the preset threshold, the controller 12 can set the corresponding estimated phase currents $i_a(k)$, $i_b(k)$, and $i_c(k)$ to zero to limit the accumulation of estimation error.

As illustrated in FIG. 2, the controller 12 may generate signals indicating the condition of the electric drive system 10. For example, if the controller 12 determines the condition of the electric drive system 10 to be unacceptable, then the controller 12 may generate one or more signals indicating an unacceptable condition of the electric drive system 10. In such an example, the controller 12 may generate a fault signal 76 indicating that one or more problems exist in the electric drive system 10.

Referring to FIG. 2, the fault signal 76 may indicate that the electrical connection between the inverter 14 and the motor 16 is loose or disconnected. Also, the fault signal 76 may indicate a failure of one or more of the current sensors 36, 38, the resolver 44 in the electric drive system 10, the bus voltage sensor (not shown), or other components or subsystems in the electric drive system 10. In addition, the fault signal 76 may indicate the grounding fault in the motor 16. The grounding fault may be due to a number of things, such as wearing or decomposition of winding insulation (not illustrated) of the motor 16 and/or incorrect connection of the cable 18 or the three wires 24, 26, 28 to the motor 16.

As shown in FIG. 2, the controller 12 can transmit the fault signal 76 to a vehicle system controller (VSC) 80 or electronic control unit (ECU). The vehicle system controller 80 can receive the fault signal 76 and control one or more systems in the automotive vehicle. For example, the vehicle system controller 80 may control the operation of the electric drive system 10 in an effort to manage or solve the one or more problems that may exist in the electric drive system 10. In such an example, the vehicle system controller 80 may change the torque and speed generated by the motor 16. However, the vehicle system controller 80 may change any number of operations in the electric drive system 10 in response to the fault signal 76.

As illustrated in FIG. 2, the controller 12 may include a dynamic state estimator 90. The dynamic state estimator 90 executes various operations of the controller 12. For example, the dynamic state estimator 90 can be used to dynamically transform motor phase currents $i_a$, $i_b$, and $i_c$ (illustrated in FIG. 2) to the calculated currents $i_d$ and $i_q$. Furthermore, the dynamic state estimator 90 may be used to dynamically calculate the first and second estimated amounts of current $i_d(k)$ and $i_q(k)$. In addition, the dynamic state estimator 90 may be used to determine the amount of error between the calculated currents and the estimated currents. The dynamic state estimator 90 can be implemented in a computer program or some other type of programmable logic device. The dynamic state estimator 90 may provide a number of benefits, such as efficient computation, relatively fast dynamics, and improved estimation accuracy.

Figure 1:
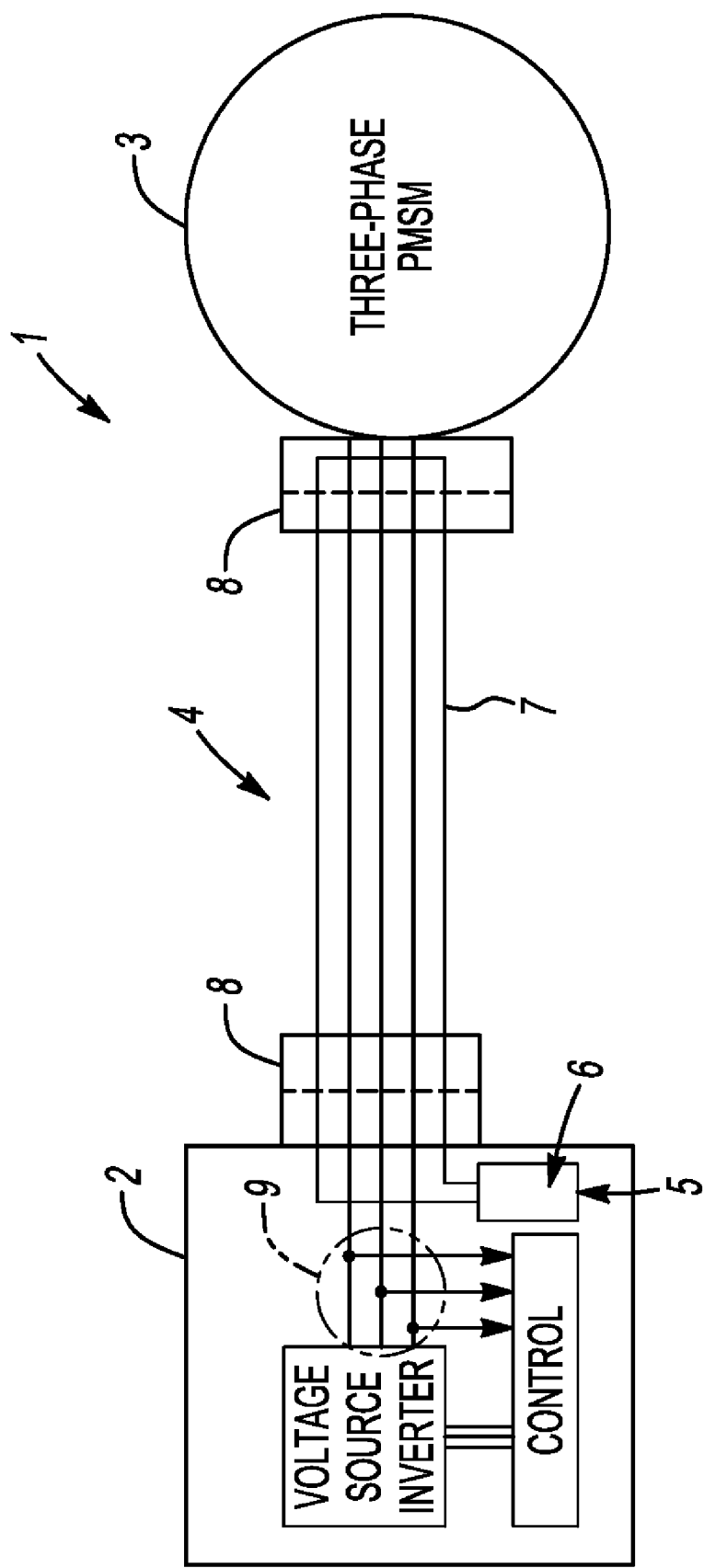
FIG. 1 is a schematic diagram illustrating a prior art electric drive system of an automotive vehicle having three current sensors, a three-wire high-voltage cable, connectors, and an interlock system embedded into the cable and the connectors.

The electric drive system 10 has a number of advantages or benefits. In addition, the electric drive system 10 simplifies the electric drive system 10 and reduces the need for non-standardized components between the inverter 14 and the motor 16. The electric drive system 10 does not require the relatively expensive and customized components illustrated in FIG. 1: the dedicated circuit 6, the three-wire high-voltage cable 4 having the dedicated low-voltage signal cable 7 embedded therein, and the connectors 8 including the dedicated low-voltage signal cable 7 embedded therein.

The transformer 50 provides a number of advantages or benefits to the electric drive system 10. The transformer 50 allows the electric drive system 10 to use only two current sensors 36, 38, instead of the three current sensors 9. Reducing the number of current sensors decreases the cost and size of the electric drive system 10. Furthermore, the transformer 50 allows the electric drive system 10 to be more cost-effective than other interlock systems. The transformer 50 may cost less than a current sensor. In addition, the transformer 50 may increase the reliability of the electric drive system 10.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. An electric drive system having a three-wire high-voltage cable extending between a drive system inverter and a three-phase permanent-magnet synchronous motor, the system comprising:
a current transformer including a voltage source inverter, the voltage source inverter having a DC bus capacitor and being configured to generate a high-frequency common-mode pulse-width-modulated voltage and apply the high-frequency common-mode pulse-width-modulated voltage between the drive system inverter and the motor when the drive system inverter is in an idle state, the high-frequency common-mode pulse-width-modulated voltage providing a high-frequency common-mode current through the cable, the current transformer being positioned to detect the high-frequency common-mode current through the cable to obtain a common-mode current signal; and
a controller configured to determine a condition of the electric drive system in response to the common-mode current signal when the drive system inverter is in the idle state and to generate a discharge signal to discharge the DC bus capacitor when the controller detects an inadequate electrical connection between the drive system inverter and the motor.

2. The electric drive system of claim 1, wherein the condition of the electric drive system indicates whether the cable provides an electrical connection between the drive system inverter and the motor.

3. The electric drive system of claim 1, wherein the condition of the electric drive system indicates whether a grounding fault exists in the electric drive system.

4. The electric drive system of claim 1 wherein the controller generates control signals to control torque and speed of the motor in the electric drive system based on the condition of the electric drive system.

5. The electric drive system of claim 1, wherein the controller transmits the discharge signal to the voltage source inverter to discharge the DC bus capacitor.

6. The electric drive system of claim 1 wherein the controller compares the high-frequency common-mode current embedded in the common-mode current signal to a predetermined common-mode current threshold to determine whether the cable provides an electrical connection between the drive system inverter and the motor.

7. The electric drive system of claim 1 wherein the current transformer includes secondary windings configured to sense the high-frequency common-mode current, a magnetic core disposed within the secondary windings, and a processor configured to receive the high-frequency common-mode current from the secondary windings and generate the common-mode current signal.

8. The electric drive system of claim 1 wherein the current transformer operates between 10 and 50 kilohertz.

9. The electric drive system of claim 1 wherein the controller receives and processes a first sensor signal indicating a first amount of current flowing through a first wire of the cable, a second sensor signal indicating a second amount of current flowing through a second wire of the cable, and a resolver signal having position information of the motor to calculate an amount of error based on calculated currents and estimated currents, and wherein the controller determines the condition of the electric drive system based on the amount of error.

10. The electric drive system of claim 9 wherein the controller generates control signals to control torque and speed of the motor in the electric drive system based on the amount of error.

11. An electric drive system having a three-wire high-voltage cable extending between a drive system inverter and a three-phase permanent-magnet synchronous motor (PMSM), first and second current sensors generating respective first and second sensor signals indicating respective first and second amounts of current flowing through the cable, and a resolver generating a resolver signal having position information of the motor, the system comprising:
a controller configured to receive the first and second sensor signals as well as the resolver signal, calculate an amount of error between calculated currents and estimated currents in response to first and second sensor signals as well as the resolver signal, and determine a condition of the electric drive system based on the amount of error;
wherein the controller implements a dynamic state estimator to calculate first and second calculated currents based on the respective first and second sensor signals and the resolver signal, first and second estimated currents based on the resolver signal, and compare the calculated currents and the estimated currents to calculate the amount of error between the calculated currents and the estimated currents.

12. The electric drive system of claim 11 wherein the controller determines whether the amount of error between the calculated currents and the estimated currents lies within a predetermined range of error to determine the condition of the electric drive system.

13. The electric drive system of claim 11 wherein the controller generates a fault signal indicating one or more problems in the electric drive system when the amount of error between the calculated currents and the estimated currents lies outside a predetermined range of error.

14. The electric drive system of claim 11, wherein the controller is configured to generate control signals to control torque and speed of the motor based on the amount of error.

15. The electric drive system of claim 11, wherein the condition of the electric drive system indicates whether the cable provides an electrical connection between the drive system inverter and the motor.

16. The electric drive system of claim 11, wherein the condition of the electric drive system indicates whether a grounding fault exists in the electric drive system.

17. The electric drive system of claim 11, wherein the controller generates control signals to control torque and speed of the motor in the electric drive system based on the condition of the electric drive system.

18. The electric drive system of claim 11, wherein the controller compares the high-frequency common-mode current embedded in the common-mode current signal to a predetermined common-mode current threshold to determine the condition of the drive system inverter.

19. An electric drive system comprising:
a drive system inverter;
a three-phase permanent-magnet synchronous motor;
a three-wire high-voltage cable extending between the drive system inverter and the motor;
a pair of current sensors configured to generate respective sensor signals indicating respective amounts of current flowing through the cable;
a resolver generating a resolver signal having position information of the motor;

a voltage source inverter configured to generate a high-frequency common-mode pulse-width-modulated voltage and to apply the high-frequency common-mode pulse-width-modulated voltage between the drive system inverter and the motor to selectively provide common-mode current through the cable;

a current transformer including secondary windings for sensing a high-frequency common-mode current flowing through the three-wire high-voltage cable and a processor configured to receive the high-frequency common-mode current from the secondary windings and generate a common-mode current signal embedding high-frequency common-mode current information; and a controller comparing the high-frequency common-mode current information to a predetermined common-mode current threshold to determine whether the cable provides an electrical connection between the drive system inverter and the motor;

receiving the respective sensor signals and the resolver signal to calculate an amount of error between calculated currents and estimated currents; and determining a condition of the electric drive system based on whether the cable provides the electrical connection as well as the amount of error between the calculated currents and the estimated currents;

wherein the controller implements a dynamic state estimator configured to determine calculated currents based on the respective sensor signals and the resolver signal:

to determine estimated currents based on the resolver signal;

to compare the calculated currents and the estimated currents to calculate the amount of error;

to determine whether the amount of error lies within a predetermined range of error; and to generate a fault signal indicating one or more problems in the electric drive system when the amount of error lies outside the predetermined range of error.

20. The electric drive system of claim 19, wherein the controller is configured to generate control signals to control torque and speed of the motor based on the amount of error.

* * * * *